United States Patent
Li

(10) Patent No.: US 10,014,850 B2
(45) Date of Patent: Jul. 3, 2018

(54) DRIVING STAGE CIRCUIT WITH PLURAL CLAMPING LEVELS

(71) Applicant: RICHTEK TECHNOLOGY CORPORATION, Zhubei, HsinChu (TW)

(72) Inventor: Hsinlun Li, Taipei (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 15/287,719

(22) Filed: Oct. 6, 2016

(65) Prior Publication Data
US 2017/0359055 A1    Dec. 14, 2017

Related U.S. Application Data

(60) Provisional application No. 62/347,675, filed on Jun. 9, 2016.

(51) Int. Cl.
| | |
|---|---|
| H03K 3/00 | (2006.01) |
| H03K 17/0812 | (2006.01) |
| H03K 5/08 | (2006.01) |
| H03K 17/082 | (2006.01) |
| H03K 17/10 | (2006.01) |
| H03K 17/12 | (2006.01) |

(52) U.S. Cl.
CPC ......... H03K 17/08122 (2013.01); H03K 5/08 (2013.01); H03K 17/0822 (2013.01); H03K 17/102 (2013.01); H03K 17/122 (2013.01)

(58) Field of Classification Search
CPC .... H03K 17/08122; H03K 5/08; H03K 5/086; H03K 5/088
See application file for complete search history.

(56) References Cited

U.S. PATENT DOCUMENTS

| | | | | |
|---|---|---|---|---|
| 5,038,058 | A * | 8/1991 | Wang | H03K 19/017518 326/31 |
| 5,929,664 | A * | 7/1999 | Alleven | H03K 17/162 327/108 |
| 6,788,128 | B2 * | 9/2004 | Tsuchida | H03K 17/0822 327/309 |
| 7,453,308 | B2 * | 11/2008 | Tihanyi | H03K 17/0822 327/108 |

(Continued)

*Primary Examiner* — Kenneth B Wells
(74) *Attorney, Agent, or Firm* — Tung & Associates

(57) ABSTRACT

The present invention provides a driving stage circuit, including a driving switch circuit and a conduction resistance adjusting circuit. The driving switch circuit generates an output signal according to a switch control signal. The conduction resistance adjusting circuit clamps the switch control signal to a first clamping level according to a current flowing through the driving switch circuit when the current is higher than a first current threshold, such that the conduction resistance of the driving switch circuit is not smaller than a first resistance so that a short circuit current of the driving switch circuit is not larger than a short circuit current limit, wherein a lowest level of the conduction resistance of the driving switch circuit is smaller than a second resistance and the output voltage level does not exceeds a output voltage limit when the current is lower than the first current threshold.

8 Claims, 4 Drawing Sheets

(56) References Cited

U.S. PATENT DOCUMENTS 8,922,259 B2 * 12/2014 Yamauchi ........ H03K 17/08128
 327/108
8,994,410 B2 * 3/2015 Tokioka ................ H02M 3/158
 323/288

* cited by examiner

DRIVING STAGE CIRCUIT WITH PLURAL CLAMPING LEVELS

CROSS REFERENCE

The present invention claims priority to U.S. 62/347,675, filed on Jun. 9, 2016.

BACKGROUND OF THE INVENTION

Field of Invention

The present invention relates to a driving stage circuit. Particularly it relates to a driving stage circuit which can adaptively adjust the conduction resistance of the driving stage circuit. The driving stage circuit may be applied for example in a gamma correction amplifier circuit or a level shifter.

Description of Related Art

FIG. 1A shows a prior art signal output processing circuit (signal output processing circuit 1) which may be, for example but not limited to, a gamma correction amplifier circuit or a level shifter for a display panel. The signal output processing circuit 1 includes a driving stage circuit 39 which includes driving switch circuits MP0 and MN0. A front-end circuit 20 generates switch control signals VGP and VGN. The driving stage circuit 39 operates the driving switch circuits MP0 and MN0 according to the switch control signals VGP and VGN to generate an output signal at an output node OUT. Generally, the output signal is required to comply with the specifications for output voltage levels VOH and VOL, which relate to equivalent resistances of the driving switch circuits. When the driving switch circuits are implemented by MOSFETs (for example MP0 and MN0 shown in the figure), to comply with the specifications for output voltage levels VOH and VOL, common prior art approaches to lower the conduction resistances of the driving switch circuits are increasing the channel widths of the MOSFETs and applying higher gate-to-source voltages (VGS) thereto.

However, the low conduction resistance of a driving switch circuit may result in violating another specification, that is, the short circuit current specification. In order to comply with the short circuit current specification, in a prior art approach, the driving stage circuit 39 is equipped with a clamping circuit 391 as shown in the prior art in FIG. 1B, for clamping the switch control signals VGP and VGN (i.e. the gate voltages of the driving switches MP0 and MN0). Nevertheless the clamping voltage may increase the conduction resistances of the driving switch circuits MP0 and MN0, thus leading to violating the aforementioned specification for output voltage level VOH or VOL.

FIG. 2 shows characteristic curves of the conduction resistance, the output voltage level VOL and the short circuit current of the driving switch MN0 shown in FIGS. 1A and 1B (for simplicity, only characteristic curves related to the output voltage level VOL and the driving switch MN0 are illustrated, while the characteristic curves related to the output voltage level VOH and the driving switch MP0 are similar and therefore omitted). As shown in the RON curve in FIG. 2, to comply with the specification for the output voltage level VOL, VGC2 can be selected as the gate voltage of the driving switch MN0 (wherein VGC2 may be for example at the same level as the positive power supply such as VPP as shown in FIG. 1A), such that the corresponding conduction resistance RON2 is relative lower whereby the corresponding output voltage level VOL2 can comply with the VOL specification, that is, the output voltage level VOL2 can be lower than an output voltage limit VOLMAX. However, under such circumstance, the corresponding driving switch short circuit current ISC2 exceeds a short circuit current limit ISCMAX and thus violates the specification for short circuit current. On the other hand, if the gate voltage VGN as shown in FIG. 1B is clamped to for example VGC1 such that the corresponding short circuit current ISC1 can comply with the short circuit current specification (i.e., lower than the short circuit current limit ISCMAX), the corresponding output voltage level VOL1 will not comply with the VOL specification (i.e., exceeding the output voltage limit VOLMAX). Actually, as shown in FIG. 2, when VG3 (corresponding to the output voltage limit VOLMAX) >VG4 (corresponding to the short circuit current limit ISCMAX), it is not possible to find one gate voltage level which can comply with both the aforementioned VOL and short circuit current specifications.

The present invention solves the aforementioned issues of the prior art circuits. The driving switches of the present invention have adaptively adjustable conduction resistances such that they can meet both the output voltage level and the short circuit current specifications. The channel widths of the MOSFETs do not need to be increased, so the switch circuits occupy less area and thus cost less.

SUMMARY OF THE INVENTION

From one perspective, the present invention provides a driving stage circuit, comprising: at least one driving switch circuit, configured to operably generate an output signal according to a switch control signal, wherein when a current flows through the driving switch circuit, the driving switch circuit includes a conduction resistance; and a conduction resistance adjusting circuit, configured to operably control the switch control signal according to the current, wherein when the current is higher than a first current threshold, the conduction resistance adjusting circuit clamps the switch control signal to a first clamping level such that the conduction resistance of the driving switch circuit is not smaller than a first resistance, whereby a short circuit current of the driving switch circuit does not exceed a short circuit current limit; and when the current is lower than the first current threshold, the conduction resistance adjusting circuit clamps or does not clamp the switch control signal, wherein a lowest level of the conduction resistance is smaller than a second resistance, so that an output voltage level of the driving switch circuit does not exceed an output voltage limit.

In one embodiment, the first resistance is larger than the second resistance.

In one embodiment, when the current is lower than the first current threshold, the conduction resistance adjusting circuit clamps the switch control signal to a second clamping level.

In one embodiment, the conduction resistance adjusting circuit includes: a comparison circuit, configured to operably generate a comparison result according to the current and the first current threshold; a clamping level generating circuit, configured to operably generate at least one target clamping level, and clamp the switch control signal to the at least one target clamping level, wherein the at least one target clamping level includes the first clamping level; and a clamping control circuit, configured to operably adjust the target clamping level according to the comparison result.

In one embodiment, the clamping level generating circuit includes at least one diode for generating the at least one target clamping level.

In one embodiment, the clamping level generating circuit includes at least one clamping switch for generating the at least one target clamping level.

In one embodiment, the first current threshold is an over-current protection threshold.

In one embodiment, the driving stage circuit is for use in a gamma correction amplifier circuit or a level shifter.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 3:
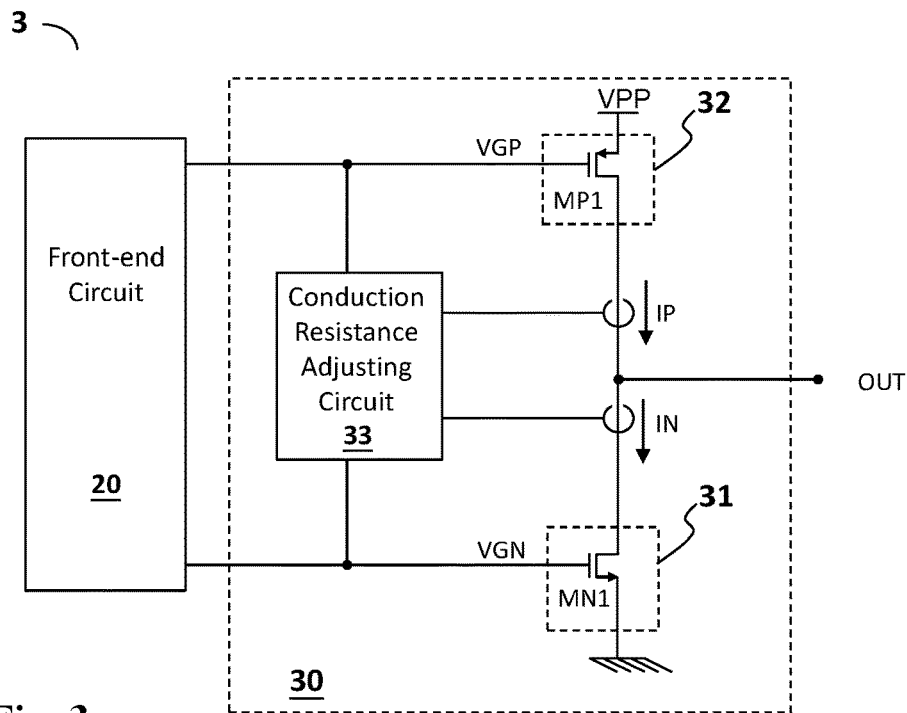
FIG. 3 shows a block diagram of an embodiment of the driving stage circuit according to the present invention.

FIG. 3 shows a block diagram of an embodiment of the driving stage circuit (driving stage circuit 30) according to the present invention, wherein the driving stage circuit 30 is for use in a signal output processing circuit (signal output processing circuit 3). The signal output processing circuit 3 may be for example but not limited to a gamma correction amplifier circuit or a level shifter of a display panel. The driving stage circuit 30, including at least one driving switch circuit (driving switch circuit 31 or driving switch circuit 32), is connected between a fixed voltage level and an output node OUT (the driving switch circuit 31 is connected between a ground node and the output node OUT, while the driving switch circuit 32 is connected between a positive power supply VPP and the output node OUT, as shown in the figure). In one embodiment, the driving switch circuit 31 includes a MOSFET switch MN1 and the driving switch circuit 32 includes a MOSFET switch MP1. The driving stage circuit 30 receives switch control signals VGP and/or VGN from a front-end circuit 20 (in one embodiment, the driving switch circuits 31 and 32 are N-type and P-type MOSFETs respectively, and VGP and VGN may be the same signal; while in other embodiments, the driving switch circuits 31 and 32 and VGP and VGN may be configured differently from that described above), for controlling the conductive levels of the driving switch circuits 31 and 32 accordingly to generate an output signal at the output node OUT, wherein the conductive level of the driving switch circuit 31 and the conductive level of the driving switch circuit 32 may include for example but not limited to a completely not-conductive state and plural conductive states of different levels, and the plural conductive states correspond to plural different conduction resistances.

Figure 4:
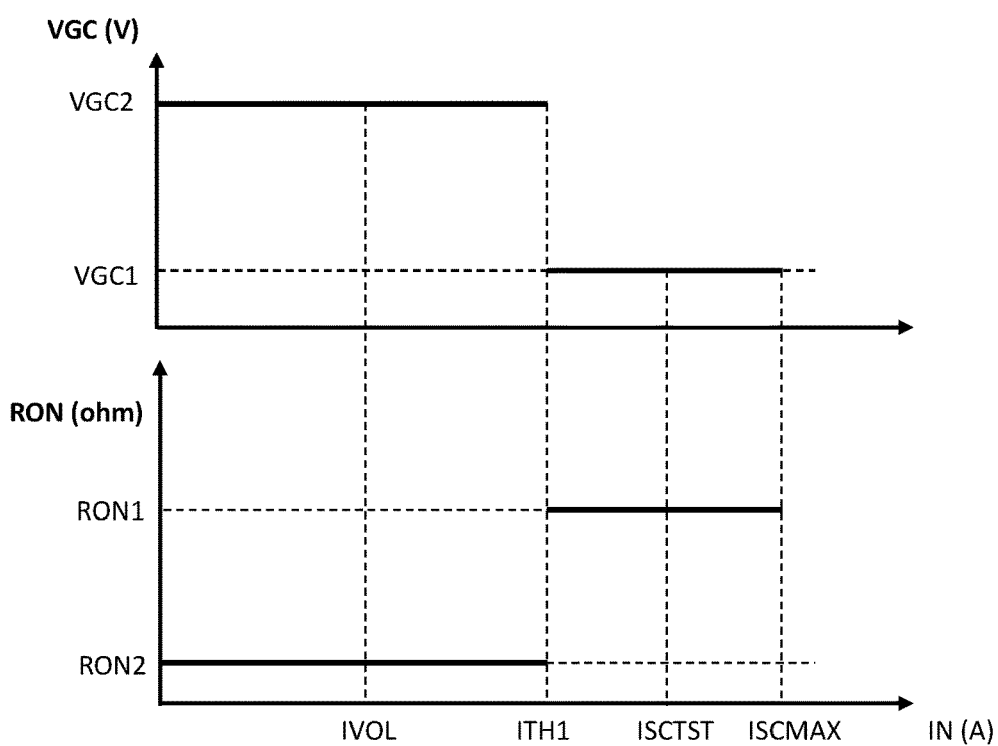
FIG. 4 shows characteristic curves corresponding to FIG. 3.

Still referring to FIG. 3, the driving stage circuit 30 further includes a conduction resistance adjusting circuit 33 which clamps the switch control signals VGP or VGN according to currents IP or IN flowing through the driving switch circuit 32 or 31. The driving switch circuit 31 is illustrated and explained in detail herein, while the driving switch circuit 32 can be understood by analogy. Referring to FIG. 4 together with FIG. 3, when the current IN is higher than a first current threshold ITH1, the conduction resistance adjusting circuit 33 clamps the switch control signal VGN to a first clamping level VGC1 such that the conduction resistance RON of the driving switch 31 is not smaller than a first resistance RON1, so that a short circuit current ISC of the driving switch circuit 31 does not exceed a short circuit current limit ISCMAX. To "clamp the switch control signal to a first clamping level" means to clamp the switch control signal VGP or VGN generated by the front-end circuit 20 such that the switch control signal VGP or VGN does not exceed (but can be lower than) the first clamping level. And when the current IN is lower than the first current threshold ITH1, the conduction resistance adjusting circuit 33 can clamp or does not clamp the switch control signal VGN, wherein a lowest level of the conduction resistance of the driving switch circuit 31 is smaller than a second resistance, so that an output voltage level VOL of the driving switch circuit 31 does not exceed an output voltage limit VOLMAX (shown in FIG. 2 but not shown in FIG. 4). The aforementioned second resistance may be a resistance (for example RON2) which is smaller than RON3 (corresponding to VOLMAX and VGC3) as shown in FIG. 2.

Figure 1A:
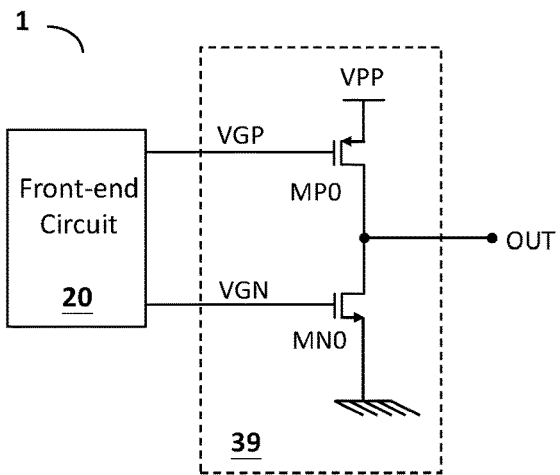
FIG. 1A shows a schematic diagram of a prior art signal output processing circuit.
Figure 1B:
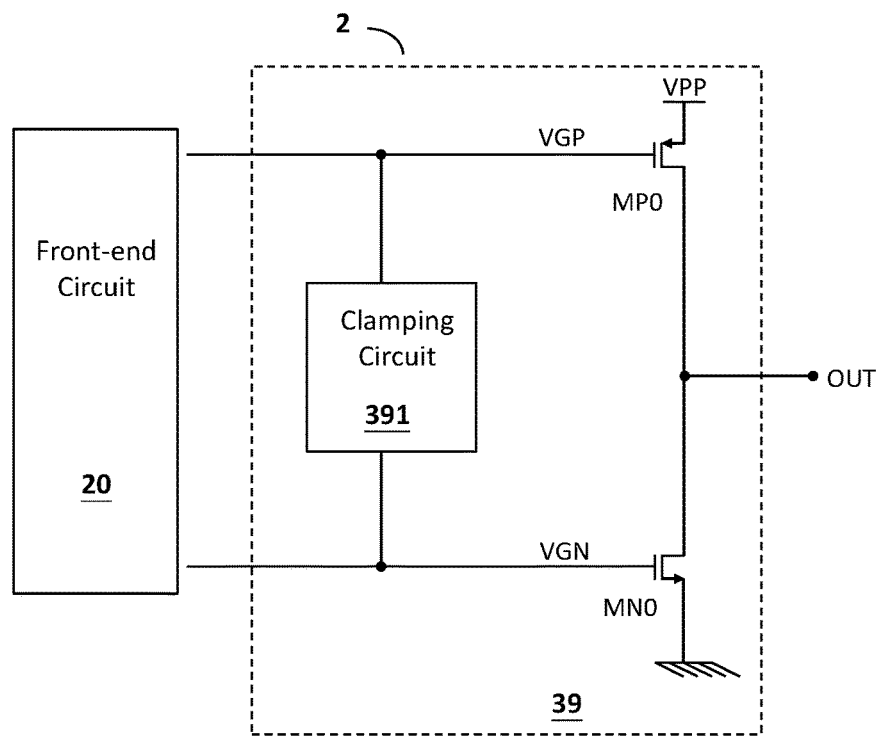
FIG. 1B shows a schematic diagram of a prior art signal output processing circuit which includes a clamping circuit.
Figure 2:
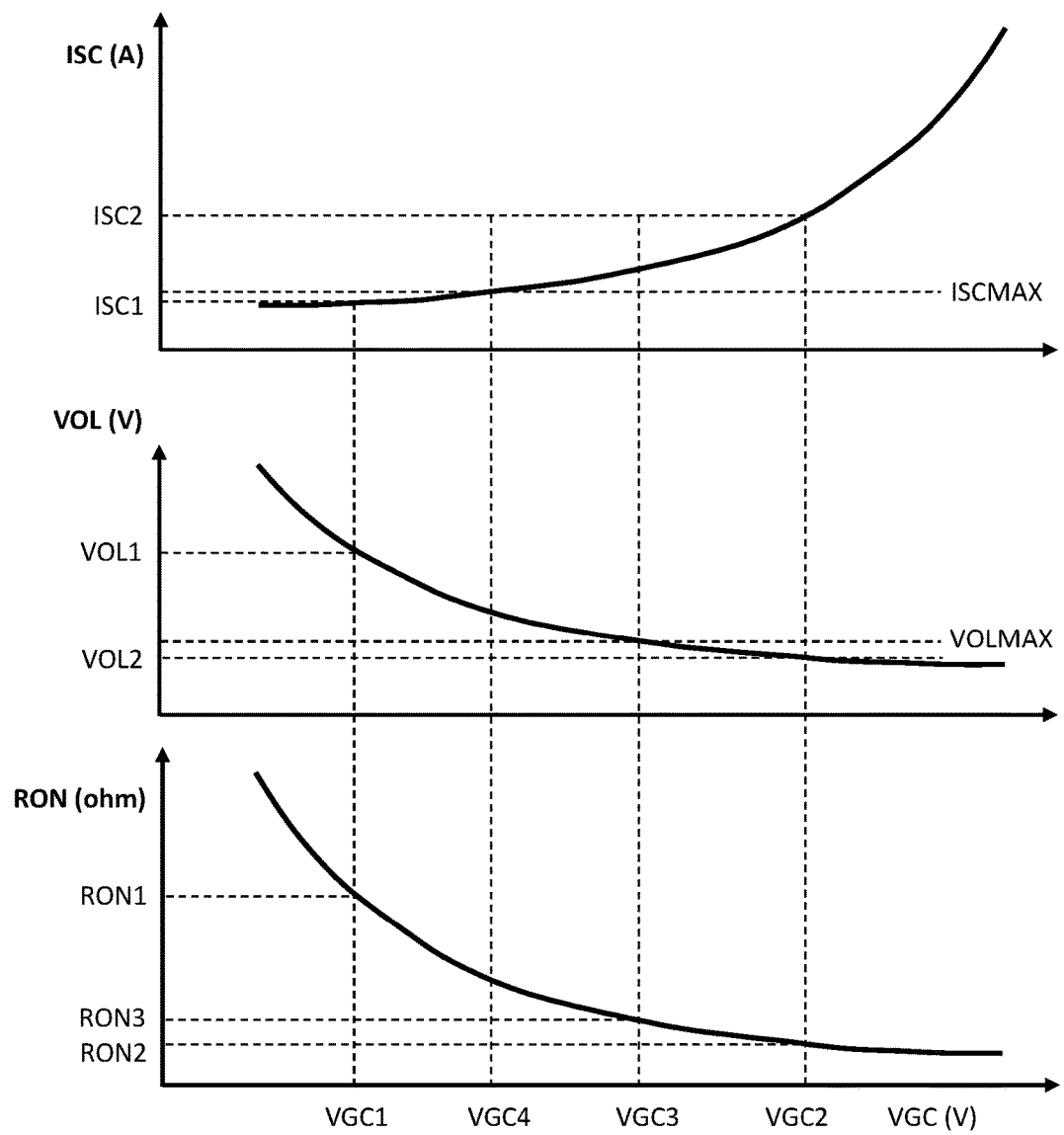
FIG. 2 shows characteristic curves corresponding to FIGS. 1A and 1B.

In one embodiment, when the current IN is lower than the first current threshold ITH1, the conduction resistance adjusting circuit 33 further clamps the switch control signal VGN to a second clamping level (the second clamping level may be for example VGC2), such that a lowest level of the conduction resistance RON of the driving switch circuit 31 is smaller than a second resistance (the second resistance may be for example RON2), so that the output voltage level VOL of the driving switch circuit 31 does not exceed an output voltage limit VOLMAX (shown in FIG. 2 but not shown in FIG. 4).

The characteristic curves of the current IP, the switch control signal VGP and the conduction resistance RON of the driving switch circuit 32 are similar to those shown in FIG. 4; however, the clamping level threshold of the switch control signal VGP and the resistance threshold of the conduction resistance can be set different from those in FIG. 4 when necessary.

The technical feature of the present invention can be understood by referring to FIG. 2. The driving stage circuit of the present invention can clamp the switch control signal (such as VGN) to different clamping levels adaptively according to the level of the current (such as IN) flowing through the driving switch circuit (such as 31), such that the conduction resistance RON of the driving switch circuit 31 is adaptively adjusted, whereby both the aforementioned specifications can be met. For example, during testing the output voltage level VOL or when the output signal is adjusted to the output voltage level VOL in a real application, the lowest level of the conduction resistance RON of the driving switch circuit 31 should be as low as possible; hence, the conduction resistance adjusting circuit 33 can clamp the switch control signal VGN to a higher clamping level, for example the VGC2 as shown in FIG. 2 (that is, VGC2 may be a clamped higher level, or an unclamped level, which is for example the highest possible level that the front-end circuit 20 can generate as the switch control signal VGN), to ensure that the output voltage level VOL complies with the specification of the output voltage limit VOLMAX (i.e. lower than VOLMAX, for example VOL2 as shown in FIG. 2). On the other hand, during testing the short circuit current or when a real short circuit happens during normal operation, the switch control signal VGN can be clamped to a lower clamping level, for example VGC1 in FIG. 2, such that the conduction resistance RON of the driving switch circuit 31 is not too low, whereby it is ensured that the short circuit current ISC complies with the short circuit current specification (i.e. lower than the short circuit current limit ISCMAX, for example ISC1 as shown in FIG. 2).

Note that in general, when testing the output voltage level VOL or when the output signal is adjusted to the output voltage level VOL in a real application, the level of the current IN usually is lower, for example but not limited to 100 mA or below. On the other hand, when testing the short circuit current or when a real short circuit happens during normal operation, the level of the current IN usually is higher, for example but not limited to 250 mA or higher. Therefore, a current level between the above two levels can be selected as the aforementioned first current threshold ITH1. In one embodiment, the first current threshold ITH1 preferably corresponds to a current protection threshold (such as 250 mA). Note that all the numbers mentioned above are only examples, but not for limiting an actual product made according to the present invention.

From another aspect, the technical feature of the present invention can be understood by referring to FIG. 4. When the current IN is lower than the first current threshold ITH1 (for example, corresponding to the output voltage level test current IVOL), the conduction resistance adjusting circuit (such as 33 in FIG. 3) of the driving stage circuit (such as 30) of the present invention can clamp the switch control signal VGN to a higher clamping level, for example the VGC2 as shown in FIG. 2 (wherein VGC2 may be a clamped higher level, or an unclamped level), and a lowest level of the conduction resistance RON of the driving switch circuit 31 is lower than a second resistance RON2, so that the output voltage level VOL is lower than (ITH1*RON2) and does not exceed the output voltage limit VOLMAX (shown in FIG. 2). On the other hand, when the current IN is higher than the current threshold ITH1 (for example, corresponding to the short circuit current level ISCTST, which is obtained by applying a testing voltage VSC at the OUT node for short circuit current test), the conduction adjusting circuit 33 clamps the switch control signal VGN to a lower level, for example the first clamping level VGC1, such that the conduction resistance RON of the driving switch circuit 31 is not lower than a first resistance RON1, whereby the short circuit current level ISCTST of the driving switch circuit 31 does not exceed the short circuit current limit ISCMAX.

Note that the driving stage circuit of the present invention, because of its capability of adaptively adjusting the driving switch conduction resistance, is particularly advantageous when it is not possible to find one level for the switch control signal to comply with both the aforementioned specifications (i.e. when the gate voltage corresponding to the output voltage limit VOLMAX>the gate voltage corresponding to the short circuit current limit ISCMAX, or from another aspect, when the first resistance>the second resistance).

Figure 5:
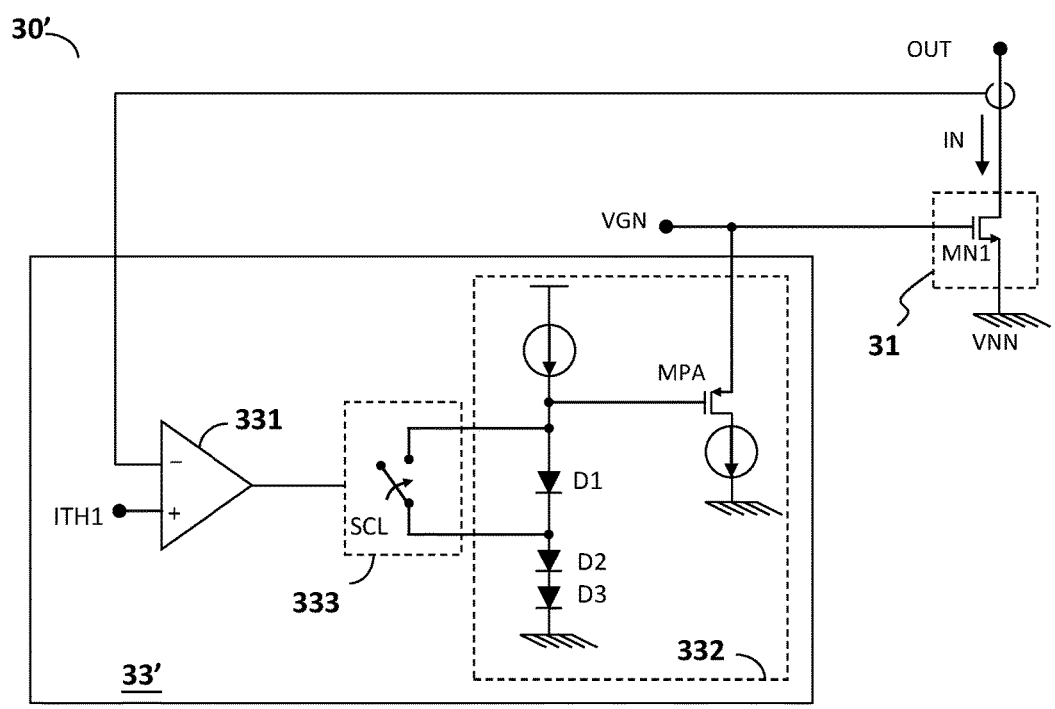
FIG. 5 shows a block diagram of a specific embodiment of the conduction resistance adjusting circuit of the driving stage circuit according to the present invention.

FIG. 5 shows a more specific embodiment of the conduction resistance adjusting circuit (conduction resistance adjusting circuit 33') of the driving stage circuit (driving stage circuit 30') according to the present invention. The conduction resistance adjusting circuit 33' includes: a comparison circuit 331, a clamping level generating circuit 332, and a clamping control circuit 333. The comparison circuit 331 is configured to operably generate a comparison result according to the current IN and the first current threshold ITH1. The clamping level generating circuit 332 is configured to generate at least one target clamping level, and clamp the switch control signal VGN to the at least one target clamping level, wherein the at least one target clamping level includes the first clamping level (for example the aforementioned VGC1). The clamping control circuit 333 is configured to operably adjust the target clamping level according to the comparison result.

In one embodiment, the clamping level generating circuit 332 includes at least one diode (for example but not limited to diodes D1, D2 and D3 as shown in FIG. 5). The clamping control circuit 333 includes at least one clamping switch (for example but not limited to the SCL shown in FIG. 5). In this embodiment, by controlling the clamping switch SCL, the conduction resistance adjusting circuit 33' can clamp the switch control signal VGN to a lower clamping level VD2+VD3+VGS(MPA) which corresponds to the first clamping level VGC1 as mentioned above, or clamp the switch control signal VGN to a higher clamping level VD1+VD2+VD3+VGS(MPA) which corresponds to the aforementioned second clamping level VGC2, wherein VD1, VD2 and VD3 indicate the forward voltages of D1, D2 and D3 respectively, and VGS(MPA) indicates the gate-to-source voltage of the level shift switch MPA.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. As an example, in the aforementioned embodiments, VOL and the corresponding driving switch circuit 31 are used for illustrating the technical features of the present invention. However for the output voltage level VOH and the corresponding driving switch circuit 32, the same spirit of the present invention can also be applied for clamping the switch control signal VGP according to the current IP, such that both the output voltage level VOH and the short circuit current specifications can be met. In the case above, the driving stage circuit may include the circuits illustrated in the aforementioned embodiments, with corresponding polarity adjustment if required. As another example, the MOSFET switches in the aforementioned embodiments may be replaced by bipolar transistor switches. As another example, the aforementioned embodiments include only one current threshold ITH1, which is for illustrative purpose and not for limiting the scope. Other embodiments according to the present invention may include plural current thresholds, and may clamp the switch control signals with three or more clamping levels corresponding to three or more current intervals. As another example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A driving stage circuit, comprising:
    at least one driving switch circuit, configured to operably generate an output signal according to a switch control signal, wherein when a current flows through the driving switch circuit, the driving switch circuit includes a conduction resistance; and
    a conduction resistance adjusting circuit, configured to operably control the switch control signal according to the current,
    wherein when the current is higher than a first current threshold, the conduction resistance adjusting circuit clamps the switch control signal to a first clamping level such that the conduction resistance of the driving switch circuit is not smaller than a first resistance threshold, whereby a short circuit current of the driving switch circuit does not exceed a short circuit current limit; and
    when the current is lower than the first current threshold, the conduction resistance adjusting circuit clamps or does not clamp the switch control signal, wherein a lowest level of the conduction resistance is smaller than a second resistance threshold, so that an output voltage level of the driving switch circuit does not exceed an output voltage limit.

2. The driving stage circuit of claim 1, wherein the first resistance threshold is larger than the second resistance threshold.

3. The driving stage circuit of claim 1, wherein when the current is lower than the first current threshold, the conduction resistance adjusting circuit clamps the switch control signal to a second clamping level.

4. The driving stage circuit of claim 1, wherein the conduction resistance adjusting circuit includes:
    a comparison circuit, configured to operably generate a comparison result according to the current and the first current threshold;
    a clamping level generating circuit, configured to operably generate at least one target clamping level, and clamp the switch control signal to the at least one target clamping level, wherein the at least one target clamping level includes the first clamping level; and
    a clamping control circuit, configured to operably adjust the target clamping level according to the comparison result.

5. The driving stage circuit of claim 4, wherein the clamping level generating circuit includes at least one diode for generating the at least one target clamping level.

6. The driving stage circuit of claim 4, wherein the clamping control circuit includes at least one clamping switch for adjusting the target clamping level.

7. The driving stage circuit of claim 1, wherein the first current threshold is an over-current protection threshold.

8. The driving stage circuit of claim 1, for use in a gamma correction amplifier circuit or a level shifter.

* * * * *